United States Patent
Lammers et al.

(12)

(10) Patent No.: US 6,539,506 B1
(45) Date of Patent: Mar. 25, 2003

(54) READ/WRITE MEMORY WITH SELF-TEST DEVICE AND ASSOCIATED TEST METHOD

(75) Inventors: Stefan Lammers, München (DE); Werner Weber, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/431,529

(22) Filed: Nov. 1, 1999

(30) Foreign Application Priority Data

Oct. 30, 1998 (DE) .......................... 198 50 115

(51) Int. Cl.[7] .................. G11C 29/00; G06F 11/00
(52) U.S. Cl. .................. 714/719; 714/711; 714/723; 714/704
(58) Field of Search ................. 714/718, 719, 714/704, 711, 723, 710, 733, 734, 735, 819, 824, 7, 42; 711/162

(56) References Cited

U.S. PATENT DOCUMENTS 3,845,476 A * 10/1974 Boehm ..................... 365/200
4,456,995 A * 6/1984 Ryan ......................... 371/21
5,337,318 A * 8/1994 Tsukakoshi et al. ........ 714/708

FOREIGN PATENT DOCUMENTS

DE    9412376 U1    1/1996

* cited by examiner

*Primary Examiner*—Christine T. Tu
(74) *Attorney, Agent, or Firm*—Laurence A. Greenberg; Werner H. Stemer; Gregory L. Mayback

(57) ABSTRACT

A read/write memory includes a monolithically integrated self-test device which iteratively enables a defect test with a redundancy analysis, without significant external test aids. The test is achieved essentially by virtue of the fact that word lines to be repaired are stored and excluded from further examinations and in each case the line having the most defects not previously detected is always determined and examined first, until either the number of repair lines no longer suffices or no more defects occur. An associated test method is also provided.

10 Claims, 3 Drawing Sheets

READ/WRITE MEMORY WITH SELF-TEST DEVICE AND ASSOCIATED TEST METHOD

BACKGROUND OF THE INVENTION

Field of the Invention

The invention relates to devices and methods for testing read/write memories with integrated redundancy in which test patterns are written to a memory array and subsequently read out and compared and, if possible, until no more defects are present, as long as word lines and column select lines are replaced by redundant lines.

On one hand, to date, self-test architectures integrated on a memory chip have only tested whether or not the associated chip is free from defects. On the other hand, a redundancy analysis in which the lines to be replaced are determined from defect addresses has been carried out to date with the aid of an external computer, since it has been the case heretofore that firstly all of the defective memory cells have been determined and only then has a corresponding replacement strategy been determined. Since a test method of that type requires inter alia a very large defect storage device, that method can only be expediently implemented with an external computer and, in practice, cannot be implemented as a built-in self-test.

SUMMARY OF THE INVENTION

It is accordingly an object of the invention to provide a read/write memory with an integrated self-test device and an associated test method, which overcome the hereinaforementioned disadvantages of the heretofore-known devices and methods of this general type and in which a complete self-test including redundancy analysis can be implemented without any significant external assistance.

With the foregoing and other objects in view there is provided, in accordance with the invention, a read/write memory, comprising at least one memory array having word lines and column select lines; and a self-test device monolithically integrated together with the at least one memory array, the self-test device having defect counters for the word lines and column select lines, redundancy consumption counters, stack storage devices for the word lines and column select lines to be repaired, a comparator connected to the stack storage devices for the word lines and column select lines to be repaired, a comparator connected to the defect counters for the word lines and column select lines, and a control unit.

In accordance with another feature of the invention, the control unit is programmed to perform the following functions in the following order:

a) initially setting all of the defect counters and redundancy consumption counters to zero;

b) comparing an information item written to the at least one memory array and an information item read from the at least one memory array and ascertaining a defective cell, with the comparators;

c) checking the word line and column select line associated with the defective cell to determine if it is already stored in the stack storage devices, and incrementing the counter associated with the respective word line and respective column select line only when one of the word line and the column select line has not yet been stored;

d) storing at least one of the word line and the column select line in the stack storage devices and incrementing the associated redundancy consumption counters if the associated defect counters exceed a repair threshold;

e) carrying out steps b) to d) for all prescribed test patterns and all cells of the at least one memory array or until one of the redundancy consumption counters overflows;

f) setting all of the defect counters to zero;

g) carrying out step b);

h) carrying out step c);

i) separately determining the word line and the column select line with the largest number of defects, with the comparators and the defect counters;

j) selecting one of the word line and the column select line with the largest number of defects;

k) storing the selected one of the lines with the largest number of defects in the stack storage devices and incrementing the associated redundancy consumption counter if the associated redundancy consumption counter has not yet overflowed;

l) carrying out step k) with the other of the lines selected according to step i) if the associated redundancy consumption counter has overflowed for the line selected according to step j);

m) terminating a test if the redundancy consumption counter overflows;

n) repeating steps f) to m) for all of the prescribed test patterns and for all of the memory cells of the at least one memory array; and o) repeating step n) until all of the defect counters remain equal to zero or one of the redundancy consumption counters overflows.

In accordance with a further feature of the invention, there are provided fewer of the defect counters than the word lines and column select lines; an additional storage device for a maximum and an associated number of defects; and switches for assigning the defect counters to different groups of the word lines and column select lines; the control unit and the comparators determining and storing the word lines and column select lines with the largest number of defects within a group in the stack storage device instead of the word lines and column select lines with a previously largest number of defects, if the number of defects is greater than the previous largest number of defects, only the cells associated with the respective group of the word lines and column select lines being tested instead of all of the cells, and the test being repeated for all of the groups in the at least one memory array.

In accordance with an added feature of the invention, step j) is carried out by selecting one of the two lines having the largest number of defects.

In accordance with an additional feature of the invention, the defect counters have a different word width only for one word line and one column select line; the stack storage devices include a stack storage device for single-bit defects and a defect stack storage device; and the control unit is programmed to perform the following functions in the following order:

a) initially setting the defect counters and redundancy consumption counters to be equal to zero;

b) using the comparators for comparing information items written to and information items read out from the at least one memory array and ascertaining and storing a defective cell in the defect stack storage device;

c) checking the word line associated with the defective cell and the column select line with one of the comparators to determine if it is already stored in the stack storage device as a defective word line, as a defective column select line or as a single-bit defect, and skipping steps d) and e) if at least one of the word line and the column select line or the individual defect is already stored;

d) separately checking the word lines and column select lines associated with the defective memory cell and stored in the defect stack storage device for further defects and incrementing at least one of the defect counter associated with the word line and the defect counter associated with the column select line only when a respective further defect has not yet been stored in the stack storage device;

e) storing at least one of the word lines and the column select lines in the corresponding stack storage device and incrementing the associated redundancy consumption counter if the associated defect counter exceeds a repair threshold;

f) setting all of the defect counters to be equal to zero and repeating steps b) to e) for all test patterns and all memory cells of the at least one memory array; and g) decreasing the repair threshold with one of the defect counters having a smaller word width and repeating step f) until, at a lowest repair threshold, the defect counters for all of the test patterns and all of the memory cells remain equal to zero or the redundancy counter overflows.

In accordance with yet another feature of the invention, in step d), further defects in the word line are sought only in the stack storage device for the column select lines to be repaired and further defects in the associated column select line are sought only in the stack storage device for the word lines.

In accordance with yet a further feature of the invention, there is provided a buffer storage device, the control unit being additionally programmed to initially perform the following functions prior to steps a) to g) in the following order:

A) storing the defective cells of one of the word lines in the buffer storage device with the word lines and column select lines;

B) checking to determine if a number of defects within one of the word lines exceeds a repair threshold prescribed by a size of the buffer storage device and accepting a buffer content in the defect stack storage device and clearing the buffer storage device if the repair threshold is not exceeded;

C) accepting a defective word line in the word line stack storage device, clearing the buffer storage device and incrementing the corresponding redundancy consumption counter if the repair threshold has been exceeded;

D) during testing of a next one of the word lines in steps A) to C), processing the defects in a previous one of the word lines in the defect stack storage device, incrementing the defect counter provided for the respective column select line and, in the event of a counter overflow, storing a relevant one of the column select lines in the stack storage device for the defective column select lines and incrementing the corresponding redundancy consumption counter; and E) repeating steps A) to D) for all of the prescribed test patterns and all of the cells of the at least one memory array or terminating and already reporting all of the prescribed test patterns and all of the cells of the at least one memory array to be non-repairable, if the defect stack storage device or one of the redundancy consumption counters overflows.

With the objects of the invention in view, there is also provided a method for testing a read/write memory with a self-test device, which comprises storing at least one of word lines and column select lines to be repaired and excluding cells of the at least one of word lines and column select lines for further examinations; determining and examining at least one of the word lines and column select lines having the most defective memory cells not yet already detected by the stored at least one of word lines and column select lines before others of the at least one of word lines and column select lines; and ascertaining if a number of redundant lines still suffices and if no more defective cells are already present.

In accordance with another mode of the invention, there is provided a method which further comprises:

a) initially setting defect counters and redundancy consumption counters to zero;

b) comparing an information item written to a memory array and an information item read from the memory array and ascertaining a defective cell;

c) checking the word line and the column select line associated with the defective cell to determine if it is already stored and incrementing the defect counter associated with the respective word line or respective column select line only when the word line or the column select line has not yet been stored;

d) storing at least one of the word line and the column select line and incrementing the associated redundancy consumption counter if the associated defect counters exceed a repair threshold;

e) carrying out steps b) to d) for all prescribed test patterns and all of the cells of the memory array or until the redundancy has been consumed;

f) setting all of the defect counters to zero;

g) carrying out step b);

h) carrying out step c);

i) separately determining the word line and the column select line with the largest number of defects, with comparators and the defect counters;

j) selecting one of the word line and the column select line with the largest number of defects;

k) storing the selected line with the largest number of defects and incrementing the redundancy consumption counter if still-required redundancy is present;

l) carrying out step k) with the other of the lines selected according to step i) if no more redundancy is present for the line selected according to step j);

m) terminating a test if the corresponding redundancy has been consumed;

n) repeating steps f) to m) for all of the prescribed test patterns and for all of the memory cells of the memory array; and o) repeating step n) until no more defects are present or the redundancy has been used up.

In accordance with a further mode of the invention, there is provided a method which further comprises:

a) initially setting all of a plurality of defect counters and all of a plurality of redundancy consumption counters to be equal to zero;

b) comparing information items written to and information items read out from a memory array and ascertaining and storing a defective cell;

c) checking the word line associated with the defective cell and the column select line to determine if it is already stored as a defective word line, a defective column select line or a single-bit defect, and skipping steps d) and e) if it is already stored;

d) separately checking buffer-stored word lines and column select lines associated with the defective memory cell for defects and incrementing at least one of the defect counter associated with the word line and the defect counter associated with the column select line only when the respective defect has not yet been stored;

e) storing at least one of word lines and column select lines and incrementing the corresponding redundancy consumption counter if the associated defect counter exceeds a repair threshold;

f) initially setting all of the defect counters to be equal to zero and repeating steps b) to e) for all test patterns and all memory cells of the memory array; and g) decreasing the repair threshold and repeating step f) until, at a lowest repair threshold, no more defects occur or one of the redundancy consumption counters overflows for all of the test patterns and all of the memory cells.

In accordance with a concomitant mode of the invention, there is provided a method which further comprises initially performing the following steps in the following order, prior to steps a) to g):

A) storing the defective cells of one of the word lines with a word line and a column select line in a buffer storage device;

B) checking to determine if a number of defects within a word line exceeds a repair threshold and, if the repair threshold is not exceeded, accepting a content of the buffer storage device in a defect stack storage device and clearing the buffer storage device;

C) storing a defective word line, clearing the buffer storage device and incrementing the corresponding redundancy consumption counter if the repair threshold has been exceeded;

D) testing the next word line in steps A) to C) while processing defects of a previous word line in the defect stack storage device, incrementing the defect counter provided for the respective column select line, storing the relevant column select line and incrementing the corresponding redundancy consumption counter, in the event of a repair threshold being exceeded; and E) repeating steps A) to D) for all of the prescribed test patterns and all of the cells of the memory array or terminating and already reporting all of the prescribed test patterns and all of the cells of the memory array to be non-repairable if the defect stack storage device or one of the redundancy consumption counters overflows.

Other features which are considered as characteristic for the invention are set forth in the appended claims.

Although the invention is illustrated and described herein as embodied in a read/write memory with a self-test device and an associated test method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention essentially resides in the fact that a read/write memory with a self-test device situated on a chip can be tested without significant external test equipment. This is accomplished by virtue of the fact that, rather than firstly all of the defects being determined and only then a redundancy analysis being carried out, instead lines to be repaired are stored and excluded from further examinations and the lines having the most defective memory cells not yet detected are always virtually replaced by redundancy lines until either there are no more redundant lines present or there are no more defective cells present.

Figure 1:
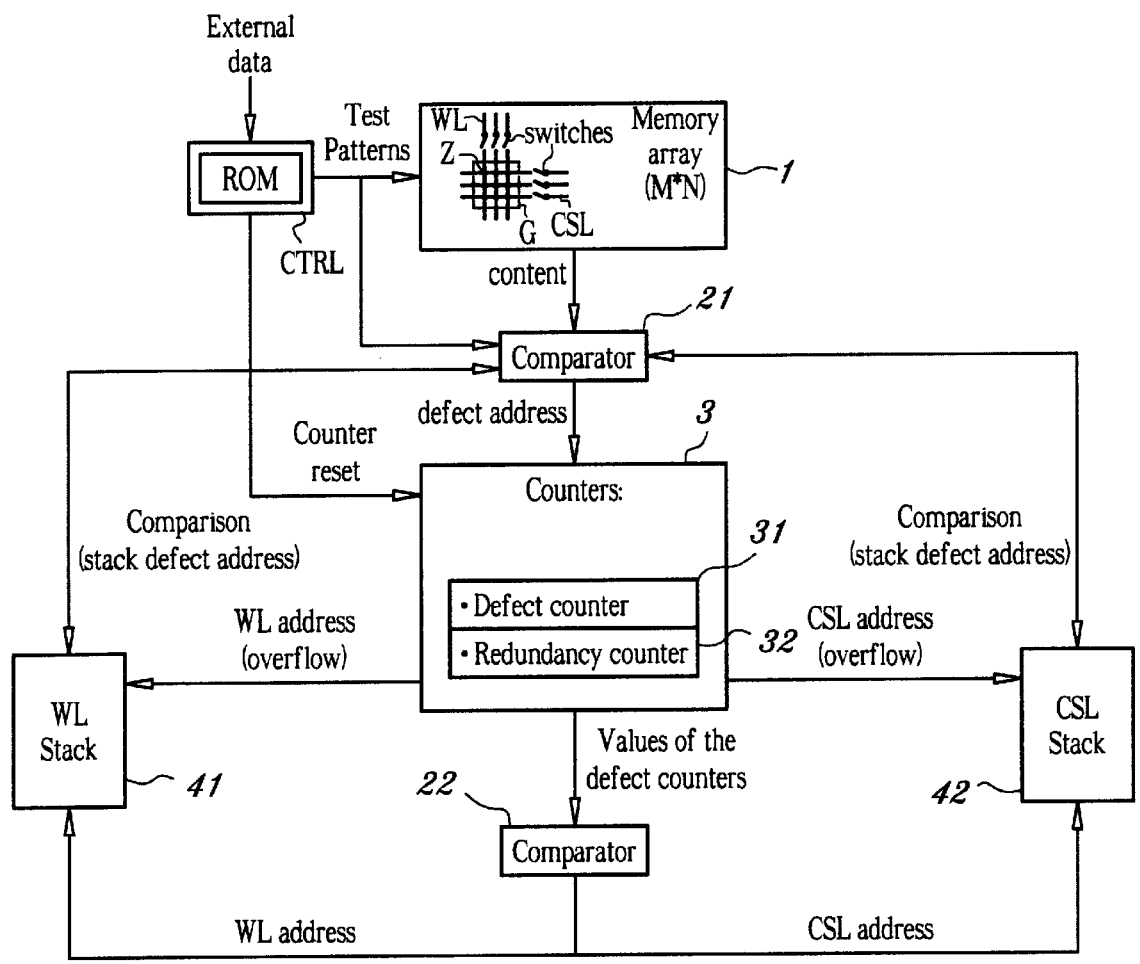
FIG. 1 is a block diagram used for explaining a first exemplary embodiment of the invention.

Referring now to the figures of the drawings in detail and first, particularly, to FIG. 1 thereof, there is seen a block diagram of a self-test architecture integrated in the memory chip and serving for repairing a memory module using existing line redundancy. The method which is realized by the architecture is iterative, that is to say it requires a plurality of test passes in order to determine the redundancy lines to be activated. A test pass includes all test patterns which are provided for the corresponding memory chip during a so-called prefuse test. Test patterns can be read into a memory array by a control unit CTRL containing a read-only memory ROM, for example. A memory array 1 in this case corresponds to a region of an overall memory array to which a certain number of redundant lines are assigned. The control unit CTRL performs an entire sequence control and can be supplied with external data. The memory array 1 has a plurality of word lines WL and a plurality of column select lines CSL and a content of the memory array is compared with the written-in test patterns by a comparator 21. Furthermore, the comparator 21 carries out a comparison of the defect address in the form of word line and column select line with defect addresses stored in corresponding stack storage devices 41 and 42. A defect address ascertained in the comparator 21 is available to defect counters 31 in a counter array 3. Moreover, redundancy counters 32 are provided in the self-test device. Values of the defect counters can be compared in a comparator 22.

In this exemplary embodiment, each word line WL and each column select line CSL has a dedicated defect counter. All of the defect counters are set to zero at the beginning of the test sequence. During the first test pass, the word and column select lines which have a particularly large number of defects are determined. A number of defects and a repair threshold, at which the respective line is intended to be replaced by a correspondingly redundant line, are defined for the word lines and the column select lines. The value of that number is dependent on the memory module to be tested, since different chips can have different redundancy organizations. An optimum choice for this repair threshold can be determined experimentally in a simple manner for the respective chip to be tested. In this case, the area requirement of the architecture also has to be taken into consideration. The repair threshold for the word lines may be different from that for the column select lines.

The defect counters are, for example, advantageously dimensioned in such a way that the limit at which a line is intended to be replaced by a corresponding redundant line is reached precisely in the event of the overflow. In this way, it is possible for the threshold that has remained to be exceeded on the basis of an overflow bit in a very simple manner.

Before the respective defect counters of a defective line are incremented, it is necessary to check whether the word line or column select line address of the defect is already stored in the associated stack storage device. In this case, the counters are not activated since the defect is already repaired. This comparison must be made as early as in the first test pass because a pass is formed of a plurality of test patterns. This prevents a defect from being rectified by a plurality of redundant lines. The addresses of the lines having defect counters that have overflowed after the first test pass are stored in the word line stack storage device 41 or in the column select line stack storage device 42, respectively. In addition, the associated redundancy counters 32 are incremented. For this purpose, it is necessary to determine the domain of the line to be replaced, because there are usually a fixedly prescribed number of redundancy lines for each word line domain and for each column select line domain of a memory chip. The memory array 1 constitutes a memory region which in turn includes WL and CSL domains. The redundancy counters are advantageously constructed in such a way that an appropriate redundancy line is no longer present in the event of an overflow. The memory module is thus non-repairable and the test can be immediately ended in this case.

After all of the test patterns have been written to the read/write memory once, a second part of the method begins. The test patterns are applied repeatedly to the read/write memory. All of the defect counters are set to zero for each test pass. The word line and column select line address of a defect is then again compared with the entries in the corresponding stack storage devices. It is only when none of the two addresses is stored in the stack storage devices 41 and 42 that the corresponding defect counters 31 are incremented. After a pass, the comparator 22 is used to decide which address, word line or column select line is stored in the stack storage device. For this purpose, firstly the word line and the column select line with the largest number of defects is determined. In this case, the values of all of the defect counters of the word lines WL and the defect counters of the column select lines CSL are separately compared with one another, and the address of the word line and of the column select line having the most defects is determined. These two values are subsequently compared with one another. The comparison reveals which of the two lines, that is to say either the word line or the column select line, ought to be repaired. If a corresponding redundancy line still exists in the relevant domain, in other words if the redundancy counter of this domain has not yet overflowed, then the address is stored in the stack storage device and the redundancy counter is incremented. Otherwise, the address of the other maximum is stored in the stack storage device. It is only when there is no more redundancy present for this line too, that the memory chip is an irreparable one and the built-in self-test can be terminated. The test is ended either if the memory chip has no more defects, that is to say that all of the defect counters are at zero after a test pass, or if no appropriate redundancy lines are present, that is to say a redundancy counter overflows. The addresses of the lines which ought to be replaced are situated in the stack storage devices 41 and 42 after a complete test sequence. These are so-called fuse information items, which are required by the laser in order to be able to repair the chip with the existing redundancy.

In order to reduce the area requirement of this built-in self-test architecture it is possible to reduce the number of defect counters, according to an advantageous refinement of the invention. The method is only insignificantly changed in this case. The reduction of the number of counters results in a longer test time, since a larger number of test passes are necessary. This is because if a counter is present for each word line and for each column select line, a line to be repaired can be determined after one test pass by the repair method described above. If fewer counters are available, then the number of required test passes increases. A different. group G of word lines and column select lines can be assigned to the defect counters in each case through the use of a switch. After each test pass, the word line and the column select line address having the most defects up to that point, as well as the associated counter values, are stored in a further stack storage device. For this purpose, all of the new counter values have to be compared with the previous maximum value, which is stored in a stack storage device. This is effective both for the word lines and for the column select lines. Afterwards, the counters are assigned to the next group of lines and the defects on these lines are counted.

Figure 2:
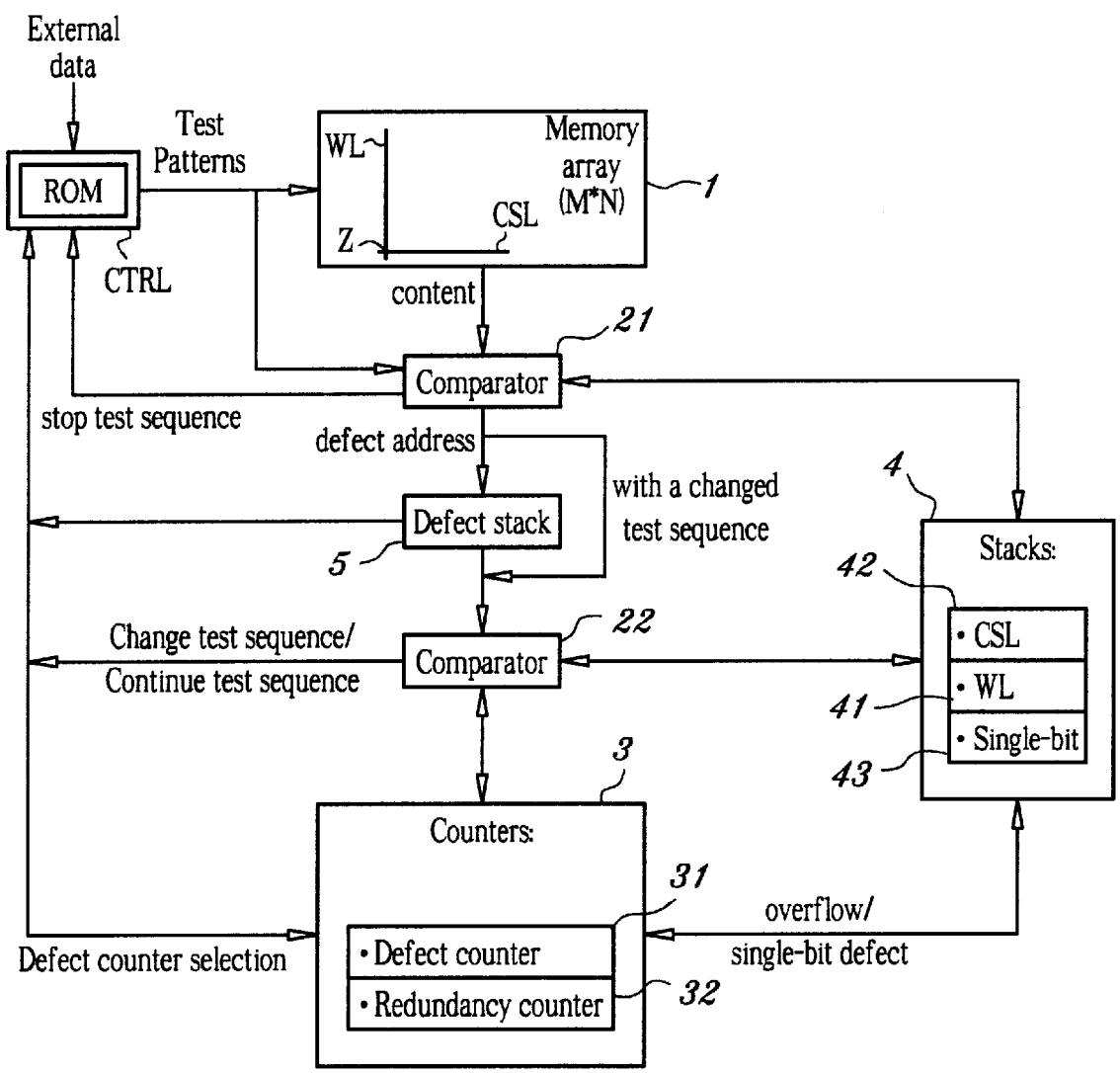
FIG. 2 is a block diagram used for explaining a second exemplary embodiment of the invention.

FIG. 2 illustrates a second exemplary embodiment of the invention in further detail. The illustration of FIG. 2 differs from that of FIG. 1 essentially due to the fact that a defect stack storage device 5 and a single-bit stack storage device 43 are additionally present. Moreover, it is indicated that the test sequence must be interrupted and an altered test sequence must take place if a defective memory cell Z is discovered.

In this method too, a plurality of test passes are necessary for the selection of the lines to be repaired. This method differs from the first exemplary embodiment in that in this concept the test sequence must be interrupted if a defect is identified. The defect address, that is to say the corresponding word line and column select line address, is then stored in the defect stack storage device. A comparator 22 subsequently checks to see whether or not the defect address is stored in one of several stack storage devices 41 . . . 43. Single-bit defects are stored in the storage device 43. If this is the case, then the test sequence is continued with another cell. Otherwise, an altered test sequence ensues. In this case, the number of all of the defects on the word line WL and on the column select line CSL of the original defect is determined separately. Before the defects are counted, it is necessary to check whether or not the additional defects have not already been rectified by the activation of a redundant line. The defect counters must be set to zero beforehand. Since, during the first comparison, it has been ascertained that both the address of the word line and the address of the column select line of the original defect have not yet been stored in a stack storage device, the following comparison operation can be simplified. In the event of a further defect on the word line of the original defect, only the stack storage device for the column select line addresses has to be examined. If an additional defect occurs on the column select line of the original defect, then only the stack storage device for the word line addresses has to be compared with the word line of the additional defect. If the number of defects exceeds a specific limit, then the. address of the line is stored in the corresponding stack storage device and the associated redundancy counter is incremented. The limit at which repair is intended to be effected is reduced in each following test pass.

This can advantageously be done by the different limits being defined by counters having a different word width. This limit is reached in the event of overflow of the respective counters. Thus, by way of example, two three-bit counters can be used in the first test pass. As a result, the addresses of the lines which have more than seven defects would then be stored in this run. Two two-bit counters could be employed in the next test pass, with the result that the limit for a necessary repair is reduced from eight to four. In the following test run, two one-bit counters can be used. The various counters are activated through commands which are stored, for example, in the memory ROM of the control unit. The number and the dimensioning of the counters depend on the memory chip to be tested.

The number of required test passes is also prescribed by the number of defect counters being used. If there are no further defects on the word line WL and the column select line CSL of the original defect, then what is involved is a single-bit defect, having an address which is stored in the stack storage device 43. The complete address, that is to say the word line and the column select line address, is stored in that storage device. This stack storage device is processed at the end of the built-in self-test. The defects stored therein can be replaced either by a redundant word line or by a redundant column select line. Since the redundant word lines are usually organized differently from the redundant column select lines, the test results differ depending on which redundancy lines have been used to rectify the single-bit defects. The complete test sequence is ended if there are no more required redundancy lines present or all of the defects have been rectified. If one of the redundancy counters overflows, then the memory chip is non-repairable and the test can be immediately terminated. The complete repair of the chip is identified by the fact that the counters always remain at zero throughout a test run. As soon as a defect counter is incremented, then the chip still has at least one defect and the test sequence cannot be ended in this case.

Figure 3:
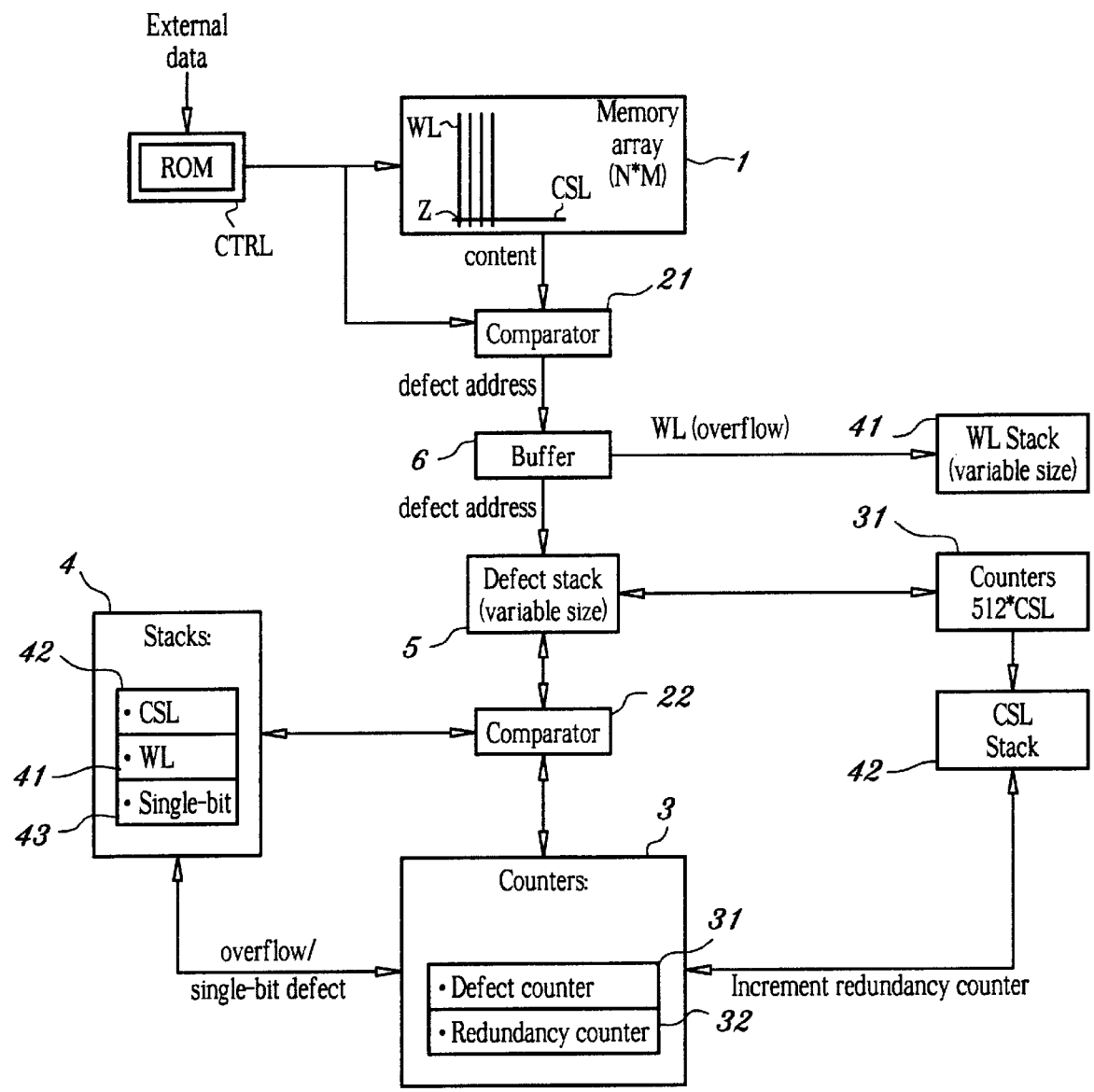
FIG. 3 is a block diagram used for explaining a third exemplary embodiment of the invention.

FIG. 3 illustrates a block diagram for explaining a third exemplary embodiment of the invention, which differs from the block diagram in FIG. 2 essentially by virtue of an additional buffer storage device 6. The major advantage of this concept is that only a single test pass is required for determining the word lines and column select lines to be replaced. In addition, the test sequence need not be altered, which would entail certain disadvantages. The defect addresses of the respective word line are stored in a buffer storage device. If a specific number of defects on this word line is exceeded, then the word line address is stored in the stack storage device 41 and the content of the buffer storage device is cleared. In addition, a corresponding redundancy counter 32 must be incremented. If the word line has fewer defects than the defined number of defects, then the complete content of the buffer storage device, that is to say all of the stored word line and column select line addresses, is written to the defect stack storage device 5 and the buffer store is subsequently cleared. The size of the defect stack storage device 5 influences the test results. While the next word line is being tested, that is to say the defect addresses are being determined and stored in the buffer storage device, the defect stack storage device is processed. The column select lines which exceed a certain number of errors are determined and stored in the stack storage device 42. For this purpose, corresponding CSL defect counters 31 are incremented. In this architecture, there is one defect counter for each column select line of the memory region to be tested. The defect counters for the respective column select lines are activated whenever new defect addresses are written to the defect storage device from the buffer storage device. If one of these defect counters overflows, then the corresponding column select line address is stored in the stack storage device 42. In addition, it is necessary to clear the associated entries, that is to say the column select line address and the word line address, from the defect stack storage device, since the defects are now repaired by the use of a redundant column select line. Moreover, the associated redundancy counter is incremented. This procedure ensures that acceptable test results are indeed obtained even with the integration of a relatively small defect stack storage device. If the defect stack storage device overflows, it is not possible to repair the chip with the aid of this method and the built-in self-test can be immediately terminated at this point. Once the test sequence is ended, the content of the defect stack storage device has to be evaluated. In order to evaluate the defect stack storage device, the method explained with regard to the second exemplary embodiment can be used, for example.

Program listings are included as an annex. Comments in the program listings have been translated into English. In certain instances, variables in the program listings are also German words. These variables remain as originally set forth because program variables can be any arbitrary association of characters.

We claim:
1. A read/write memory, comprising:
at least one memory array having word lines and column select lines; and
a self-test device monolithically integrated together with said at least one memory array, said self-test device having defect counters for said word lines and column select lines, redundancy consumption counters, stack storage devices for said word lines and column select lines to be repaired, a comparator connected to said stack storage devices for said word lines and column select lines to be repaired, a comparator connected to said defect counters for said word lines and column select lines, and a control unit;
said control unit being programmed to perform the following functions in the following order:
a) initially setting all of said defect counters and redundancy consumption counters to zero;
b) comparing an information item written to said at least one memory array and an information item read from said at least one memory array and ascertaining a defective cell, with said comparators;
c) checking said word line and column select line associated with said defective cell to determine if addresses of said word line and said column select line are already stored in said stack storage devices, and incrementing said counter associated with said respective word line and respective column select line only when one of an address of said word line and an address of said column select line has not yet been stored;
d) storing an address of at least one of said word line and said column select line in said stack storage devices and incrementing said associated redundancy consumption counters if said associated defect counters exceed a repair threshold;
e) carrying out steps b) to d) for all prescribed test patterns and all cells of said at least one memory array or until one of said redundancy consumption counters overflows;
f) setting all of said defect counters to zero;
g) carrying out step b);
h) carrying out step c);
i) separately determining said word line and said column select line with the largest number of defects, with said comparators and said defect counters;

j) selecting one of said word line and said column select line with the largest number of defects;

k) storing said address of said selected one of said lines with the largest number of defects in said stack storage devices and incrementing said associated redundancy consumption counter if said associated redundancy consumption counter has not yet overflowed;

l) carrying out step k) with the other of said lines selected according to step i) if said associated redundancy consumption counter has overflowed for said line selected according to step j);

m) terminating a test according to said test pattern if said redundancy consumption counter overflows;

n) repeating steps f) to m) for all of said prescribed test patterns and for all of said memory cells of said at least one memory array; and o) repeating step n) until all of said defect counters remain equal to zero or one of said redundancy consumption counters overflows.

2. The read/write memory according to claim 1, including:

fewer of said defect counters than a total number of said word lines and column select lines;

an additional storage device for storing a word line and column select line address having a maximum number of line and column defects and said maximum number of line and column defects; and switches for assigning said defect counters to different groups of said word lines and column select lines;

said control unit and said comparators determining said word lines and column select lines with the largest number of defects within each of said groups; said control unit storing said word line and said column select line address having said maximum number of defects and said maximum number of defects of a given one of said groups in said stack storage device when the number of defects in said given one of said groups is greater than a previously-stored maximum number of defects; said control unit testing only said cells associated with said respective group of said word lines and column select lines instead of all of said cells; and said control unit repeating the test for all of said groups in said at least one memory array.

3. The read/write memory according to claim 1, wherein step j) is carried out by selecting one of said two lines having the largest number of defects.

4. A read/write memory, comprising:

at least one memory array having word lines and column select lines; and a self-test device monolithically integrated together with said at least one memory array, said self-test device having defect counters for said word lines and column select lines, redundancy consumption counters, stack storage devices for said word lines and column select lines to be repaired, a comparator connected to said stack storage devices for said word lines and column select lines to be repaired, a comparator connected to said defect counters for said word lines and column select lines, and a control unit;

each of said defect counters having a different word width for each of said word lines and for each of said column select lines;

said stack storage devices including a stack storage device for defects with a single-bit and a defect stack storage device; and said control unit being programmed to perform the following functions in the following order:

a) initially setting said defect counters and redundancy consumption counters to be equal to zero;

b) using said comparators for comparing information items written to and information items read out from said at least one memory array and detecting a defective cell and storing an address of said defective cell in said defect stack storage device;

c) checking said address of said word line associated with said defective cell and said address of said column select line with one of said comparators to determine if said address of said word line associated with said defective cell and said address of said column select line are already stored in said stack storage device as a defective word line, as a defective column select line or as a single-bit defect, and skipping steps d) and e) if an address of at least one of said word line and said column select line or said individual defect is already stored;

d) separately checking said word lines and column select lines associated with said defective memory cell and said address of said defective memory cell being stored in said defect stack storage device for further defects and incrementing at least one of said defect counter associated with said word line and said defect counter associated with said column select line only when a respective further defect has not yet been stored in said stack storage device;

e) storing said address of at least one of said word lines and said column select lines in said corresponding stack storage device and incrementing said associated redundancy consumption counter if said associated defect counter exceeds a repair threshold;

f) setting all of said defect counters to be equal to zero and repeating steps b) to e) for all test patterns and all memory cells of said at least one memory array; and g) decreasing said repair threshold with one of said defect counters having a smaller word width and repeating step f) until, at a lowest repair threshold, said defect counters for all of said test patterns and all of said memory cells remain equal to zero or said redundancy counter overflows.

5. The read/write memory according to claim 4, wherein, in step d), said control unit determines further defects in said word line only in said stack storage device for said column select lines to be repaired and said control unit detects further defects in said associated column select line only in said stack storage device for said word lines.

6. The read/write memory according to claim 1, including a buffer storage device, said control unit being additionally programmed to initially perform the following functions prior to steps a) to g) in the following order:

A) storing addresses of said defective cells of one of said word lines in said buffer storage device;

B) checking to determine if a number of defects within one of said word lines exceeds a repair threshold prescribed by said buffer storage device and recording of said addresses from said buffer storage device in said defect stack storage device and clearing said buffer storage device if said repair threshold is not exceeded;

C) recording an address of a defective word line in said word line stack storage device, clearing said buffer storage device and incrementing said corresponding redundancy consumption counter if said repair threshold has been exceeded;

D) during testing of a next one of said word lines in steps A) to C), processing addresses associated with the defects in a previous one of said word lines in said defect stack storage device, incrementing one of said defect counters provided for said respective column select line and, in the event of a counter overflow, storing a relevant address of one of said column select lines in said stack storage device and incrementing said corresponding redundancy consumption counter; and E) repeating steps A) to D) for all of said prescribed test patterns and all of said cells of said at least one memory array, and terminating and already reporting all of said prescribed test patterns and all of said cells of said at least one memory array to be non-repairable if said defect stack storage device or one of said redundancy consumption counters overflows.

7. A method for testing a read/write memory with a self-test device, the method which comprises:

providing a memory array having word lines and column select lines;

storing addresses of at least one of word lines and column select lines to be repaired and excluding cells of the at least one of word lines and column select lines for further examinations;

selecting a previously unselected address of a word line or column select line having the most defective memory cells;

determining and examining said word line or column select line having the most defective memory cells from the word lines and the column select lines that have an address that has not already been selected before determining and examining remaining word lines and column select lines having stored addresses; and verifying if a number of redundant lines of the memory array still suffices to overcome detected defects in the memory array and if no more defective cells are already present in the memory array.

8. The method for testing a read/write memory according to claim 7, which further comprises:

a) initially setting defect counters and redundancy consumption counters to zero;

b) comparing an information item written to a memory array and an information item read from the memory array and ascertaining a defective cell;

c) checking an address of the word line and an address of the column select line associated with the defective cell to determine if the address of the word line and the address of the column select line associated with the defective cell are already stored and incrementing the defect counter associated with the respective word line only when the address of the word line has not yet been stored and incrementing the defect counter associated with the respective column select line only when the address of the column select line has not yet been stored;

d) storing addresses of at least one of the word line and the column select line and incrementing the associated redundancy consumption counter if the associated defect counters exceed a repair threshold;

e) carrying out steps b) to d) for all prescribed test patterns and all of the cells of the memory array or until the redundant lines have been consumed;

f) setting all of the defect counters to zero;

g) carrying out step b);

h) carrying out step c);

i) separately determining the word line and the column select line with the largest number of defects, with comparators and the defect counters;

j) selecting one of the word line and the column select line with the largest number of defects;

k) storing the address of the selected line with the largest number of defects and incrementing the redundancy consumption counter if a number of remaining redundant lines exceeds a still-required number of lines;

l) carrying out step k) with the other of the lines selected according to step i) if no more redundant lines are present for the line selected according to step j);

m) terminating a test if the corresponding redundancy has been consumed;

n) repeating steps f) to m) for all prescribed test patterns and for all of the memory cells of the memory array; and o) repeating step n) until no more defects in the memory array are used or the redundant lines have been used up.

9. The method for testing a read/write memory according to claim 7, which further comprises:

a) initially setting all of a plurality of defect counters and all of a plurality of redundancy consumption counters to be equal to zero;

b) comparing information items written to and information items read out from a memory array and ascertaining and storing the information items of a defective cell;

c) checking an address of the word line associated with the defective cell to determine if the address of the word line is already stored as a defective word line or a single-bit defect, and checking an address of the column select line to determine if the address of the column select line is already stored as a defective column select line or a single-bit defect, and skipping steps d) and e) if it is already stored;

d) separately checking buffer-stored addresses of word lines and column select lines associated with the defective memory cell for defects and incrementing at least one of the defect counter associated with the word line and the defect counter associated with the column select line only when the respective defect has not yet been stored;

e) storing an address of at least one of word lines and column select lines and incrementing the corresponding redundancy consumption counter if the associated defect counter exceeds a repair threshold;

f) initially setting all of the defect counters to be equal to zero and repeating steps b) to e) for all test patterns and all memory cells of the memory array; and g) decreasing the repair threshold and repeating step f) until, at a lowest repair threshold, no more defects occur or one of the redundancy consumption counters overflows for all of the test patterns and all of the memory cells.

10. The method for testing a read/write memory according to claim 9, which further comprises initially performing the following steps in the following order, prior to steps a) to g):

A) storing the information items of the defective cells of one of the word lines and a column select line in a buffer storage device;

B) checking to determine if a number of defects within a word line exceeds a repair threshold and, if the repair threshold is not exceeded, accepting contents of the buffer storage device in a defect stack storage device and clearing the buffer storage device;

C) storing a defective word line, clearing the buffer storage device and incrementing the corresponding redundancy consumption counter if the repair threshold has been exceeded;

D) testing a next word line in steps A) to C) while processing defects of a previous word line in the defect stack storage device, incrementing the defect counter provided for the respective column select line, storing an address of the relevant column select line and incrementing the corresponding redundancy consumption counter, in the event of a repair threshold being exceeded; and E) repeating steps A) to D) for all of the prescribed test patterns and all of the cells of the memory array or terminating and already reporting all of the prescribed test patterns and all of the cells of the memory array to be non-repairable if the defect stack storage device or one of the redundancy consumption counters overflows.

* * * * *